United States Patent [19]
Byrd et al.

[11] Patent Number: 5,992,681
[45] Date of Patent: Nov. 30, 1999

[54] BATTERY DOOR ASSEMBLY

[75] Inventors: Timothy J. Byrd, Goffstown, N.H.; Robert A. Orlando, No. Andover, Miss.

[73] Assignee: Schneider Automation, Inc., North Andover, Mass.

[21] Appl. No.: 09/036,877

[22] Filed: Mar. 9, 1998

[51] Int. Cl.[6] .................................................. B65D 43/14
[52] U.S. Cl. ........................... 220/831; 220/836; 220/840
[58] Field of Search .................................... 220/831, 836, 220/840

[56] References Cited

U.S. PATENT DOCUMENTS

| | | | |
|---|---|---|---|
| 2,342,477 | 2/1944 | Magnenat | 220/840 X |
| 2,555,473 | 6/1951 | Deaton | 220/840 X |
| 3,333,726 | 8/1967 | Belanger | 220/836 |
| 3,610,460 | 10/1971 | Siklos et al. | 220/836 X |
| 4,282,983 | 8/1981 | Swartzbaugh | 220/840 X |

FOREIGN PATENT DOCUMENTS

| | | |
|---|---|---|
| 44 10 171 C1 | 4/1995 | Germany . |
| 196 15 093 A1 | 10/1997 | Germany . |

*Primary Examiner*—Stephen K. Cronin
*Attorney, Agent, or Firm*—Michael J. Femal, Esq.

[57] ABSTRACT

A door latch assembly, such as for a battery compartment of an electronic device, is disclosed. The door latch assembly comprises a housing having a pair of opposed, spaced flattened pins defining an elongated surface having a depth and a generally perpendicular narrowed surface having a thickness. The door latch assembly further comprises a door having first and second clasps for receiving the respective first and second pins. Each of the clasps includes an aperture and a slot leading to the aperture. The aperture has a breadth substantially equal to the depth of the elongated surface, and the slot has a gap substantially equal to the thickness of the narrowed surface. When assembling the door to the housing, each of the slots slides over the respective elongated surface to receive and captures the respective pin in the respective aperture.

10 Claims, 5 Drawing Sheets

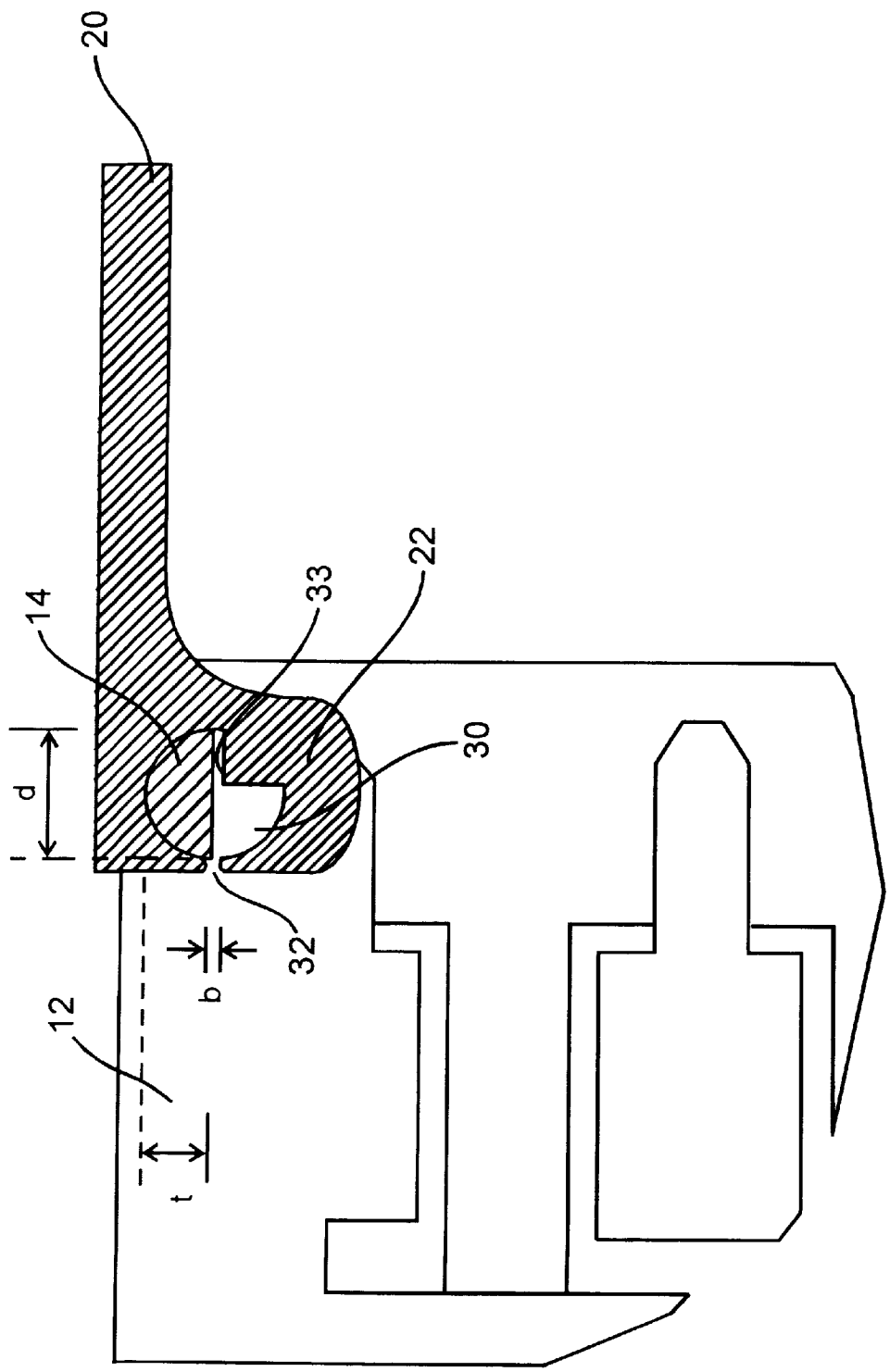

BATTERY DOOR ASSEMBLY

DESCRIPTION

1. Technical Field

The present invention relates to a door assembly, such as for a battery compartment of an electronic device.

2. Background of the Invention

Ease of assembly of components is an important consideration in the design of electronic devices. It is also important that once assembled, the components remain assembled.

SUMMARY OF THE INVENTION

It is an object of the invention to provide a door latch assembly, such as for a battery compartment housing.

In accordance with the invention, the assembly comprises a housing having a pair of opposed, spaced flattened pins defining an elongated surface having a depth and a generally perpendicular narrowed surface having a thickness. The assembly further comprises a door having first and second clasps for receiving the respective first and second pins. Each of the clasps includes an aperture and a slot leading to the aperture. The aperture has a breadth substantially equal to the depth of the elongated surface, and the slot has a gap substantially equal to the thickness of the narrowed surface. When assembling the door to the housing, each of the slots slides over the respective elongated surface to receive and capture the respective pin in the respective aperture.

It is contemplated that the pins are collinear, and substantially semi-circular in cross section.

It is further contemplated that the aperture is generally circular, and includes a projection to engage the pin.

BRIEF DESCRIPTION OF THE DRAWINGS

FIG. 5 is a sectional view of the door latch assembly of FIG. 1, with the door in the closed position.

DETAILED DESCRIPTION

Figure 1:
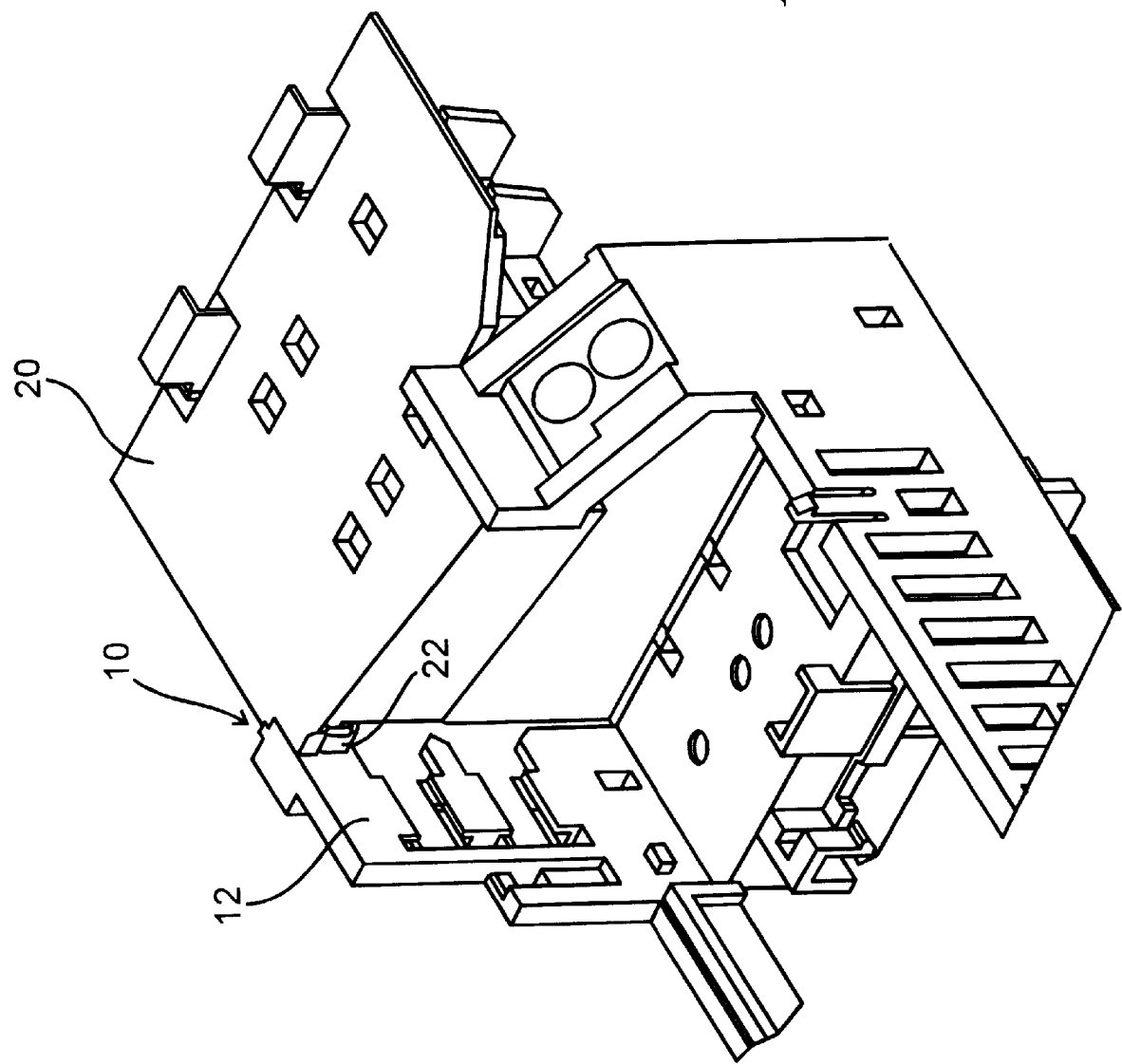
FIG. 1 is a partial perspective view of a door latch assembly in accordance with the invention.

While this invention is susceptible of embodiment in many different forms, there is shown in the drawings, and will herein be described in detail, a preferred embodiment of the invention with the understanding that the present disclosure is to be considered as an exemplification of the principles of the invention and is not intended to limit the broad aspect of the invention to the embodiments illustrated.

A door latch assembly 10 in accordance with the invention is illustrated in FIGS. 1–5. The door latch assembly 10 comprises a housing 12 having a pair of opposed, spaced, collinear flattened pins 14, defining an elongated surface having a depth 'd' and a generally perpendicular narrowed surface having a thickness 't'. Each of the pins 14 is substantially semi-circular in cross section. (See FIGS. 4 and 5) The door latch assembly 10 further comprises a door 20 having a pair of clasps 22 for receiving respective pins 14. Each of the clasps 22 includes an aperture 30 and a slot 32 leading to the aperture 30. The aperture 30 has a breadth 'b' substantially equal to the depth 'd' of the elongated surface. The aperture 30 includes a projection 33 to engage respective ones of the pins 14. The slot 32 has a gap slightly thinner than the thickness 't' of the narrowed surface.

Figure 2:
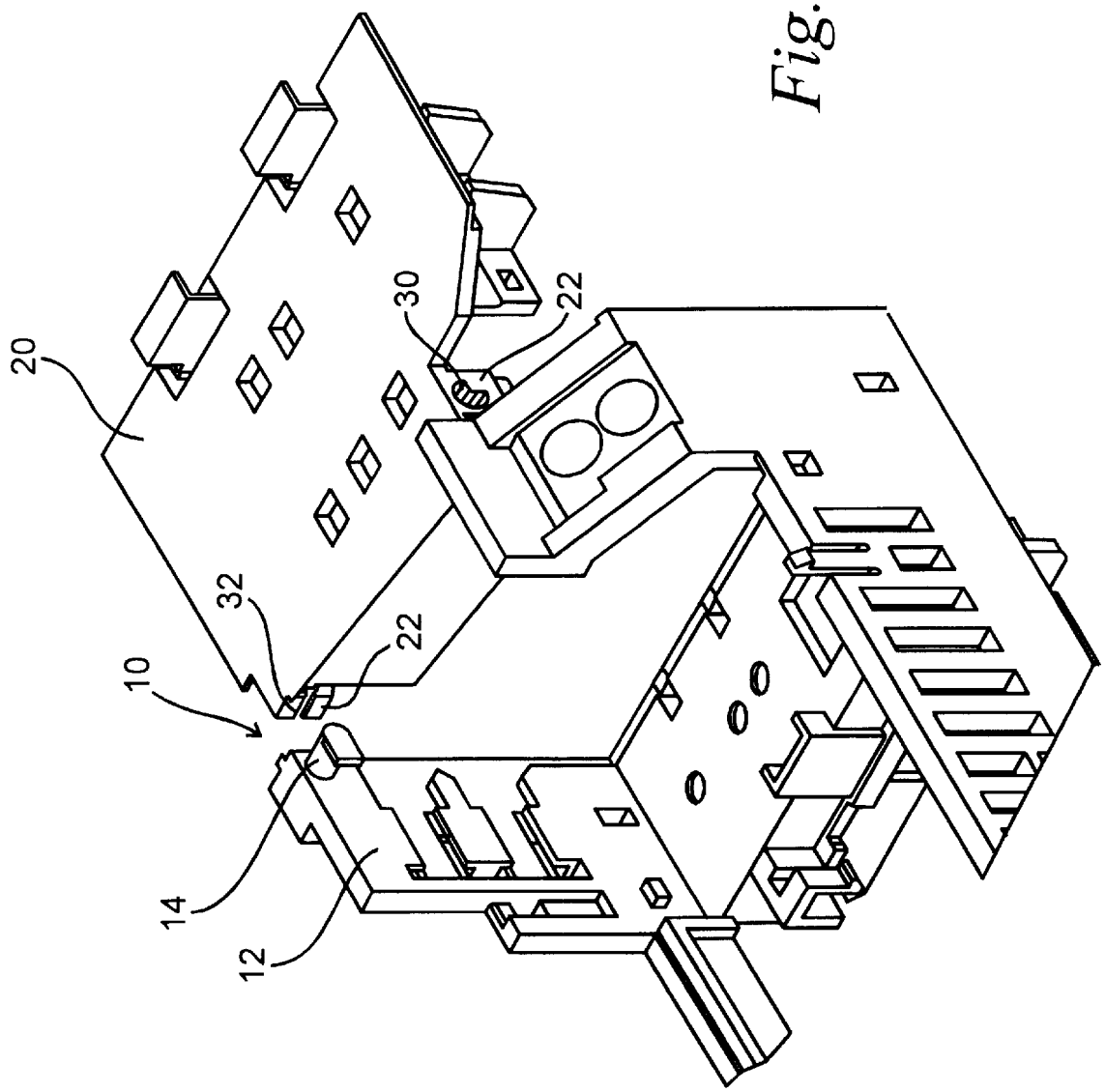
FIG. 2 is a partial perspective view of the door latch assembly of FIG. 1, illustrated with the door disassembled.
Figure 3:
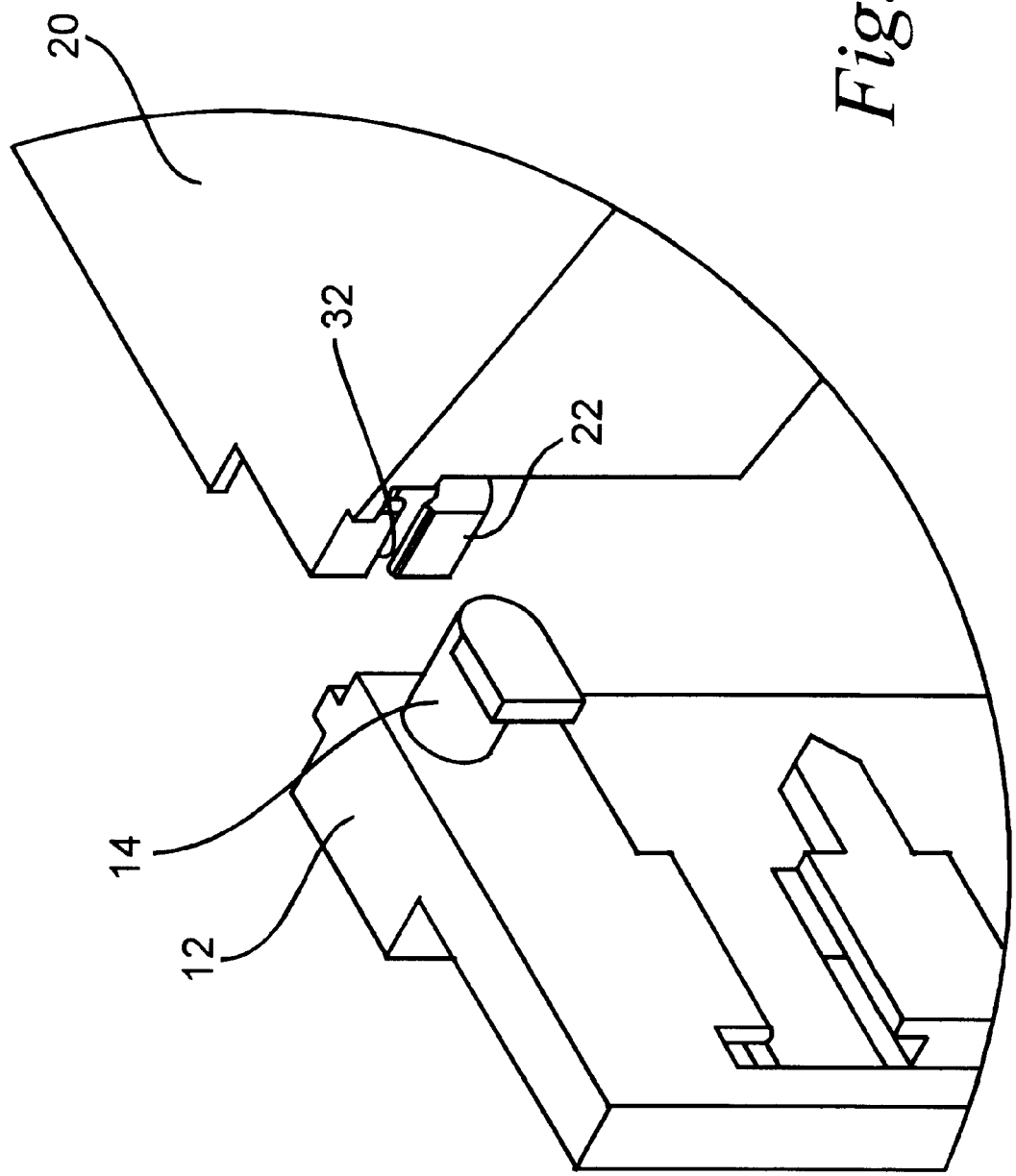
FIG. 3 is an enlarged view of the door latch assembly of FIG. 1.
Figure 4:
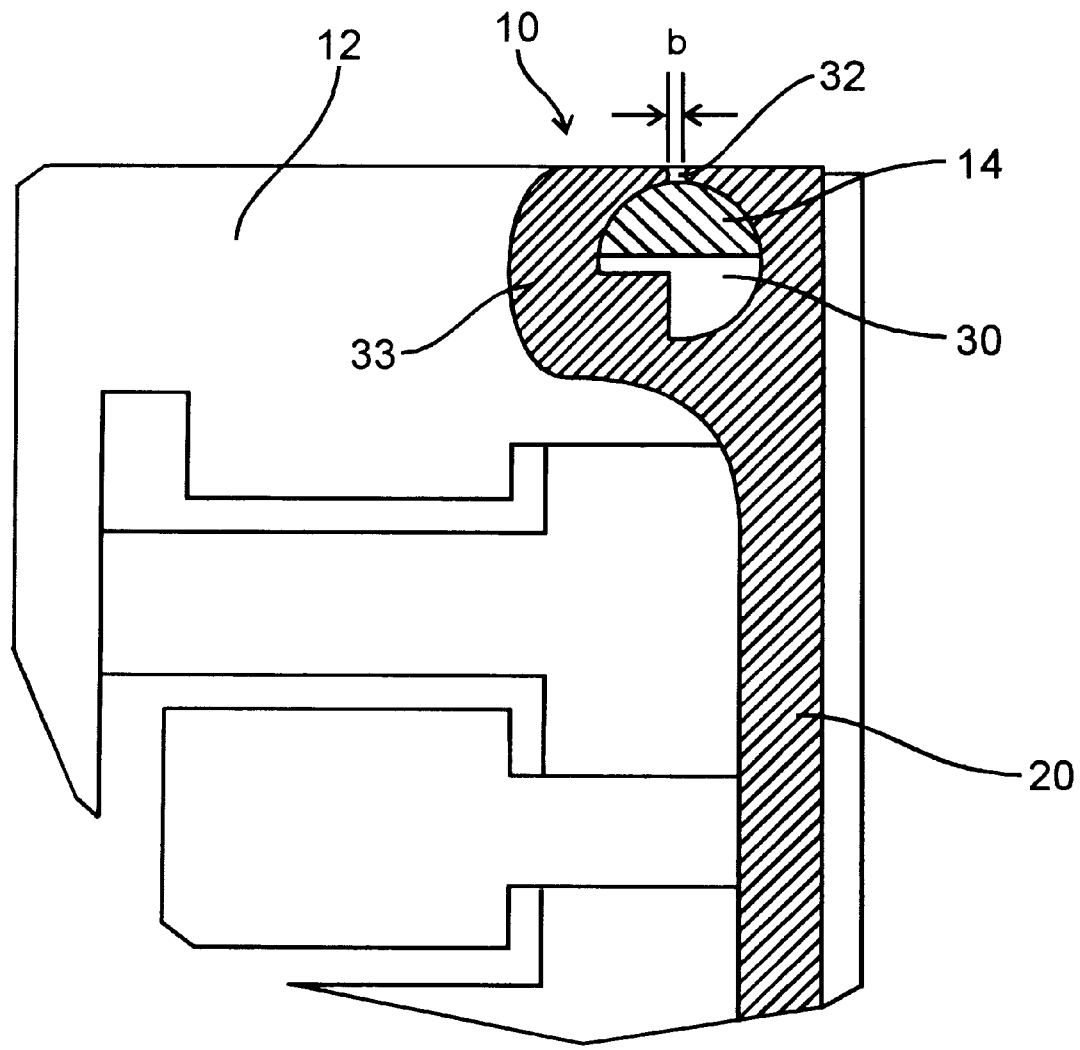
FIG. 4 is a sectional view of the door latch assembly of FIG. 1, with the door in the open position.

When assembling the door 20 to the housing 12, as illustrated in FIGS. 2, 3 and 5, each of the slots 32 is slid over the respective elongated surface of the pins 14 to receive and capture respective pins 14 in the respective aperture 30. Because the slot 32 is slightly thinner than the narrowed surface of the pins 14, once in place, the door 20 will not readily fall off of the pins 14. The projection 33 limits rotation of the door relative to the housing 12, as illustrated in FIG. 5. When the door 20 is in its closed position, as illustrated in FIG. 4, the pins 14 are securely retained to the housing 12 by the respective clasps 22.

While the specific embodiment has been illustrated and described, numerous modifications come to mind without significantly departing from the spirit of the invention, and the scope of protection is only limited by the scope of the accompanying Claims.

We claim:

1. A door latch assembly comprising:
   a housing having a pair of opposed, spaced pins defining an elongated surface having a depth and a generally perpendicular surface having a thickness; and
   a door having first and second clasps for receiving said respective first and second pins, wherein at least one of said pins is substantially semi-circular in cross section, each of said clasps including an aperture and a slot leading to said aperture, wherein said aperture includes a projection to engage said pin, wherein each of said slots are adapted to slide over said respective elongated surface to receive and capture said respective pin in said respective aperture.

2. The door latch assembly of claim 1 wherein said pins are collinear.

3. The door latch assembly of claim 1, wherein said surface is narrowed, and wherein said slot is thinner than said narrowed surface.

4. The door latch assembly of claim 1 wherein said aperture is generally circular.

5. A door latch assembly comprising:
   a housing having a pair of opposed, spaced collinear pins, each of said pins being substantially semi-circular in cross-section, said flattened pins defining an elongated surface having a depth and a generally perpendicular surface having a thickness; and
   a door having first and second clasps for receiving said respective first and second pins, each of said clasps including a substantially circular aperture and a slot leading to said aperture, wherein said aperture includes a projection to engage said pin, wherein each of said slots are adapted to slide over said respective elongated surface to receive and capture said respective pin in said respective aperture.

6. The door latch assembly of claim 5, wherein said surface is narrowed, and wherein said slot is thinner than said narrowed surface.

7. A door latch assembly for enclosing a battery for an electronic device, the door latch assembly comprising:
   a housing for said battery, said housing having a pair of opposed, spaced pins defining an elongated surface having a depth and a generally perpendicular surface having a thickness; and
   a door for closing said housing, said door having first and second clasps for receiving said respective first and second pins, wherein at least of of said pins is substantially semi-circular in cross section, each of said clasps including an aperture and a slot leading to said aperture, wherein said aperture includes a projection to engage said pin, wherein each of said slots are adapted to slide over said respective elongated surface to receive and capture said respective pin in said respective aperture.

8. The door latch assembly of claim 7 wherein said pins are collinear.

9. The door latch assembly of claim 7 wherein said aperture is generally circular.

10. The door latch assembly of claim 7, wherein said surface is narrowed, and wherein said slot is thinner than said narrowed surface.

\* \* \* \* \*

UNITED STATES PATENT AND TRADEMARK OFFICE
CERTIFICATE OF CORRECTION

PATENT NO.   : 5,992,681
DATED        : Nov. 30, 1999
INVENTOR(S)  : Timothy J. Byrd and Robert A. Orlando It is certified that errors appear in the above-identified patent and that said Letters Patent is hereby corrected as shown below:

Column 3, Line 1, Delete the first instance of the word "of" after the word "least" and insert therefor
- one -
Title page,
   item   [75] In "Inventors:" section, delete "Miss." and insert therefor - Mass. -

Signed and Sealed this

Twentieth Day of February, 2001

*Attest:*

NICHOLAS P. GODICI

*Attesting Officer*   Acting Director of the United States Patent and Trademark Office